United States Patent
Eng et al.

(10) Patent No.: US 9,558,875 B1
(45) Date of Patent: *Jan. 31, 2017

(54) ELECTRONIC DEVICE WITH SIGNAL LINE ROUTING TO MINIMIZE VIBRATIONS

(71) Applicant: Apple Inc., Cupertino, CA (US)

(72) Inventors: Michael Eng, San Jose, CA (US); Kieran Poulain, San Francisco, CA (US); Curtis C. Mead, San Jose, CA (US); Connor R. Duke, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/284,179

(22) Filed: Oct. 3, 2016

Related U.S. Application Data

(63) Continuation of application No. 14/831,109, filed on Aug. 20, 2015, now Pat. No. 9,460,838.

(60) Provisional application No. 62/044,527, filed on Sep. 2, 2014.

(51) Int. Cl.
| | |
|---|---|
| *H05K 1/00* | (2006.01) |
| *H01F 7/02* | (2006.01) |
| *H05K 5/00* | (2006.01) |
| *H05K 1/18* | (2006.01) |
| *H05B 37/02* | (2006.01) |
| *H05B 33/08* | (2006.01) |

(52) U.S. Cl.
CPC ........ *H01F 7/0252* (2013.01); *H05B 33/0842* (2013.01); *H05B 37/0227* (2013.01); *H05K 1/189* (2013.01); *H05K 5/0017* (2013.01); *H05K 2201/10106* (2013.01)

(58) Field of Classification Search
USPC .................................................. 361/749, 750
See application file for complete search history.

(56) References Cited

U.S. PATENT DOCUMENTS

| | | | |
|---|---|---|---|
| 6,276,945 B1 | 8/2001 | Hayward et al. | |
| 7,542,231 B2 | 6/2009 | Rugg et al. | |
| 8,046,904 B2 | 11/2011 | Kloeppel et al. | |
| 8,915,756 B2 | 12/2014 | Schumacher et al. | |
| 2004/0021211 A1* | 2/2004 | Damberg ............ | H01L 23/5385 257/686 |
| 2013/0104410 A1* | 5/2013 | Wade .................... | G01C 21/00 33/361 |
| 2015/0051470 A1 | 2/2015 | Bailey et al. | |

\* cited by examiner

*Primary Examiner* — Andargie M Aychillhum
(74) *Attorney, Agent, or Firm* — Treyz Law Group, P.C.; G. Victor Treyz; Joseph F. Guihan

(57) ABSTRACT

An electronic device may have a source of magnetic field such as a magnet that produces a static magnetic field. A flexible printed circuit may have a flexible tail that surrounds a central portion. The central portion may overlap the magnet. Electrical components may be mounted to the central portion. To prevent undesired vibrations and noise due to interactions between magnetic fields induced by signals flowing in signal lines in the flexible printed circuit and the static magnetic field, the signal lines may be vertically stacked or may be routed along a curved path that does not overlap the magnet. The tail may serve as a service loop that allows a portion of a housing for the device and electrical components mounted to the central portion in alignment with windows in the housing to be detached for servicing.

20 Claims, 8 Drawing Sheets

ELECTRONIC DEVICE WITH SIGNAL LINE ROUTING TO MINIMIZE VIBRATIONS

This application is a continuation of patent application Ser. No. 14/831,109, filed Aug. 20, 2015, which claims the benefit of provisional patent application No. 62/044,527 filed Sep. 2, 2014, which are hereby incorporated by reference herein in their entireties.

BACKGROUND

This relates generally to electronic devices, and, more particularly, to electronic devices that include magnets and other sources of magnetic field.

Electronic devices sometimes include sources of magnetic field such as magnets. For example, a display cover glass layer or other device structure may be mounted to a device housing using magnets and ferromagnetic materials that are attracted to magnets. Magnets and ferromagnetic materials may also be used as parts of latches in device covers, may be used to hold a device to a docking station, may be used as parts of speakers and other electrical components, and may be incorporated into other portions of a device. In some devices, magnetic fields may be produced by flowing currents and can interact with magnets and ferromagnetic material.

An electronic device supplies control signals to electrical components during operation. For example, signals may be provided to light-producing components, sensors, displays, integrated circuits, and other components.

If care is not taken, vibrations can be inadvertently produced within an electronic device. These vibrations, which may create undesirable noise, may arise due to the interaction between the magnetic field produced by a magnet, currents flowing in a device, and/or ferromagnetic material and the magnetic fields produced by time-varying currents flowing within a device.

It would therefore be desirable to be able to provide ways in which to reduce undesired noise in electronic devices such as noise that is produced from vibrations due to the interaction of magnetic fields from signal currents and magnetic fields from magnets, ferromagnetic materials, and current sources within electronic devices.

SUMMARY

An electronic device may have a source of magnetic field such as a permanent magnet, a ferromagnetic material, or currents flowing within the device. Flexible printed circuits and other substrates may couple electrical components in the device together. A flexible printed circuit may have a flexible tail that surrounds a central portion. The central portion may overlap the magnet (or other source of magnetic field) so that the magnetic field from the magnet passes through the central portion. Electrical components may be mounted to the central portion. The tail may serve as a service loop that allows a detachable portion of a housing for the device and electrical components that are mounted to the central portion in alignment with windows in the detachable portion of the housing to be detached for servicing.

The flexible printed circuit may have signal lines that extend from the tail to the central portion. Signals flowing in the signal lines may produce magnetic fields. To prevent undesired vibrations and noise due to interactions between the magnetic fields induced by the signals and the static magnetic field, the signal lines may be vertically stacked or may be routed in a spiral pattern that does not overlap the magnet.

DETAILED DESCRIPTION

Figure 1:
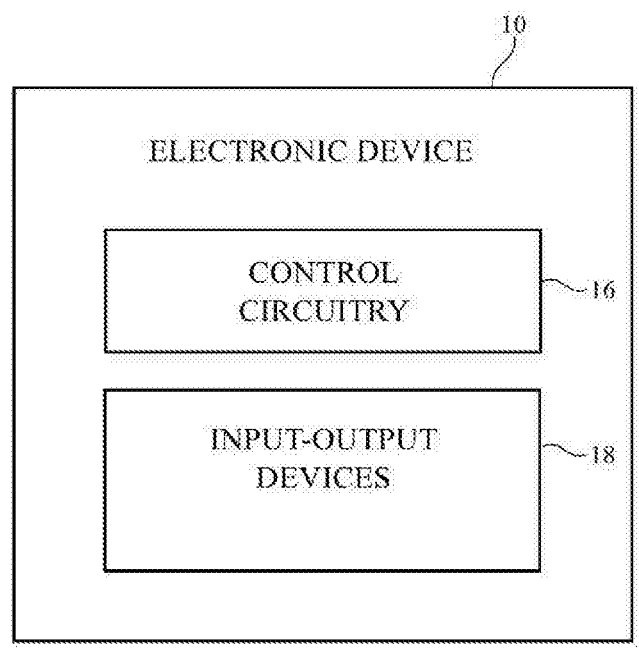
FIG. 1 is a diagram of an illustrative electronic device in accordance with an embodiment.

An illustrative electronic device is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, light-emitting diodes that form part of a sensor or communications device, light detectors that form part of a sensor or communications device, etc. A user can control the operation of device 10 by supplying commands through input-output devices 18 and may receive status information and other output from device 10 using the output resources of input-output devices 18.

Input-output devices 18 may include one or more displays. Device 10 may, for example, include a touch screen display that includes a touch sensor for gathering touch input from a user or a display that is insensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images for a user on one or more displays. Device 10 may use communications circuits to send and receive wireless and wired data. For example, device 10 may use light-emitting components to transmit data and may use light-receiving components to receive transmitted light signals. Device 10 may also use light-emitting components, light-receiving components, audio components, capacitive sensors, microelectromechanical systems devices, and other components as sensors and output devices.

Device 10 may include components that produce magnetic fields. For example, device 10 may include solenoids and other electromagnetic components that produce magnetic fields when driven with current. Device 10 may also include one or more magnets. Permanent magnets may produce static magnetic fields. Particularly in device configurations in which devices such as device 10 contain magnets that produce static magnetic fields, there is a potential for unwanted vibrations to develop within the devices during operation.

Figure 2:
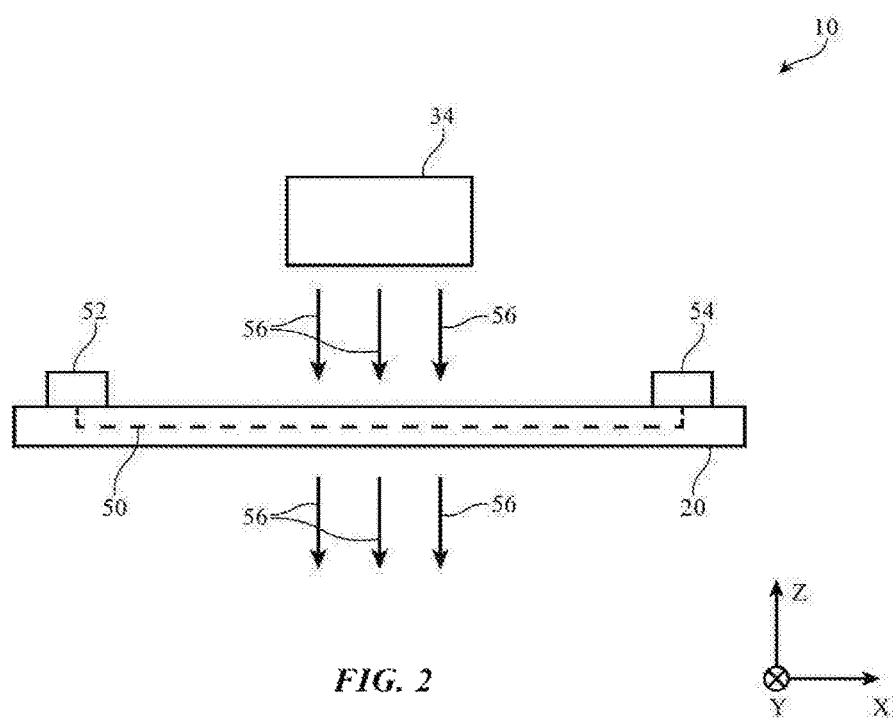
FIG. 2 is a diagram of an illustrative magnet and structures in an electronic device that may produce magnetic fields that interact with magnetic fields from the magnet in accordance with an embodiment.

Consider, as an example, the components of device 10 of FIG. 2. In the example of FIG. 2, device 10 includes magnet 34. Magnet 34 may be a permanent magnet that produces static magnetic field 56. Device 10 may also include one or more substrates such as substrate 20 that include signal lines 50. Substrate 20 may overlap a source of magnetic field such as magnet 34, so that magnetic field 56 passes through substrate 20. In some configurations, magnetic field 56 may be produced by currents flowing in device 10, by a ferromagnetic material, and/or other sources of magnetic field. Configurations in which magnetic field is produced by magnet 34 are sometimes described herein as an example. This is, however, merely illustrative. Magnetic field 56 may, in general, be produced by any source.

Substrate 20 may be a plastic carrier, a layer of glass, ceramic, or other dielectric, may be a printed circuit, or may be other dielectric structure that serves as a support for signal lines 50. Signal lines 50 may be metal traces (e.g., metal traces that are deposited and patterned using photolithography) or other conductive signal lines. Printed circuit board substrates that may be used for forming substrate 20 include rigid printed circuit board substrates (e.g., printed circuits formed form fiberglass-filled epoxy or other rigid printed circuit board material) and flexible printed circuit substrates (e.g. printed circuits formed from flexible sheets of polyimide or other flexible layers of polymer).

Signal lines 50 may carry signals between circuits on different portions of printed circuit 20. For example, signal lines 50 may carry digital signals, analog signals, power supply signals, etc. In the example of FIG. 2, signal lines 50 form a signal path that conveys signals between component 52 and component 54. Components 52 and 54 may be integrated circuits, discrete components such as a inductors, capacitors, and resistors, may be switches, sensors, light-emitting components such as light-emitting diodes, light sensors, vibrators, speakers, microphones, displays, touch pads, keys, and other input-output devices 18, control circuitry 16 and/or other components in device 10. As an example, component 52 may be an integrated circuit that produces control signals and/or that processes sensor signals. Paths such as path 50 may be used to convey control signals between component 52 and component 54. Components 54 may be a light-emitting diode(s) that is controlled by the control signals in path 50, light sensor(s) that supply data to component 52 over path 50, etc.

Device 10 may include a source of magnetic field such as component 34. Component 34 may be a permanent magnet or other component that produces magnetic field 56 (e.g., a static magnetic field produced by a permanent magnet). Printed circuit 20 lies in the X-Y plane of FIG. 2. Magnetic field 56 in the example of FIG. 2 is oriented vertically and crosses printed circuit 20 and signal path 50 at a right angle. Magnet 34 may be used to hold device 10 to a cradle, may be used as a clasp that holds a cover or case lid in a closed position, may be used as a detectable identifier (e.g., to produce magnetic fields that help identify device 10 to mating equipment), or may serve other functions within device 10.

When signals are carried over path 50, magnetic fields may be produced in the vicinity of magnet 34. These induced magnetic fields may interact with static magnetic field 56. In configurations in which path 50 carries time-varying signals, the magnetic fields that are induced by the signals will also be time varying. When the induced magnetic fields interact with static magnetic field 56, forces may be impressed upon printed circuit 20 and magnet 34. For example, forces may be produced that alternately cause magnet 34 and printed circuit 20 to be attracted towards each other and repelled apart from each other. These forces can cause printed circuit 20, magnet 34, and other structures in device 10 to vibrate and produce undesired noise.

Figure 3:
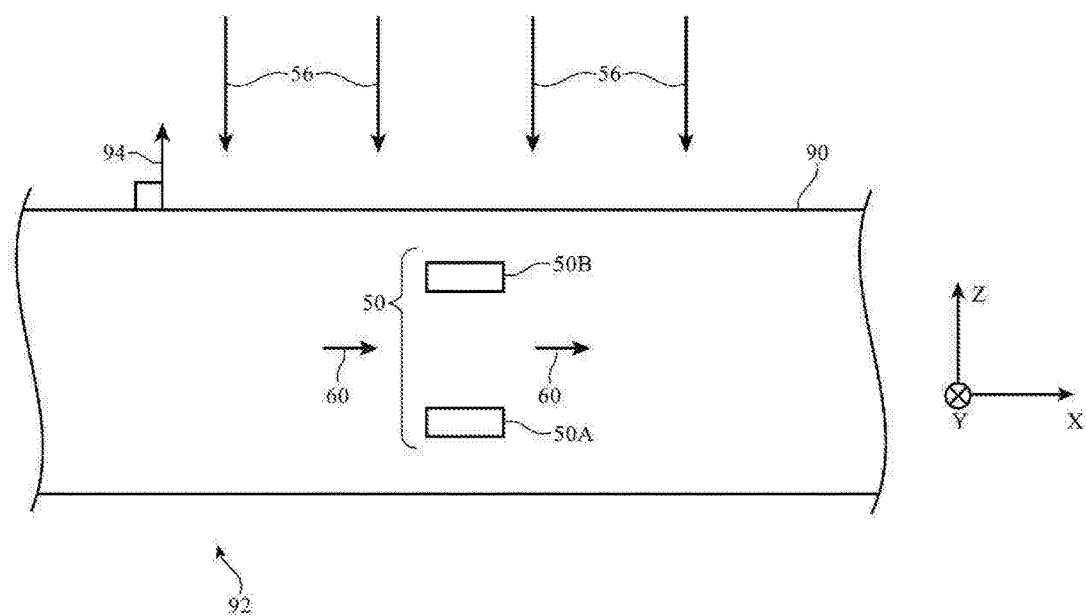
FIG. 3 is a cross-sectional side view of an illustrative flexible printed circuit having signal lines arranged to minimize vibrations in accordance with an embodiment.

Device 10 preferably includes signal path configurations for paths such as path 50 that help to reduce vibrations and thereby minimize or eliminated undesired noise. FIG. 3 is a cross-sectional side view of an illustrative portion of a printed circuit in which signal path lines have been configured to help minimize interactions with magnetic field 56. Printed circuit 92 of FIG. 3 may be a rigid printed circuit board or a flexible printed circuit. As shown in FIG. 3, printed circuit 92 may have substrate 90. Substrate 90 may be a flexible substrate formed from a flexible sheet of polyimide or other flexible polymer layer (as an example). Metal lines 50A and 50B may form signal path 50. Metal lines 50A and 50B may be formed in two respective metal layers in printed circuit 92 (i.e., printed circuit 92 may be a multilayer printed circuit board in which line 50B is stacked above line 50A).

In the example of FIG. 3, magnetic field 56 is oriented vertically (parallel to vertical dimension Z), whereas printed circuit 92 lies in the X-Y plane (i.e., surface normal 94 of printed circuit 92 is parallel to magnetic field 56). Lines 50B and 50A run into and out of the page in the orientation of FIG. 3 (i.e., lines 50A and 50B run parallel to each other along the Y dimension). Line 50B overlaps line 50A (i.e., lines 50A and 50B have the same footprint when viewed in direction −Z). When a current is being applied to a component such as component 54 (e.g., a light-emitting diode or other component), current will flow out of the page in line 50B and will flow into the page in line 50A. In this configuration, a current loop is established in the Y-Z plane that produces lateral magnetic field 60. The magnitude of induced magnetic field 60 may vary as a function of time in scenarios in which the signal in path 50 is time varying, giving rise to a risk of unwanted vibrations due to the interaction between magnetic field 60 and magnetic field 56. Nevertheless, because of the vertical alignment of line 50B over 50A, magnetic field 60 is oriented in the lateral X direction. The lateral orientation of magnetic field 60 relative to the vertical orientation of magnetic field 56 (i.e., the perpendicular orientation of field 60 relative to field 56) minimizes interaction between magnetic field 60 and magnetic field 56 and thereby helps to reduce magnetic-field-interaction-induced noise in device 10.

Figure 4:
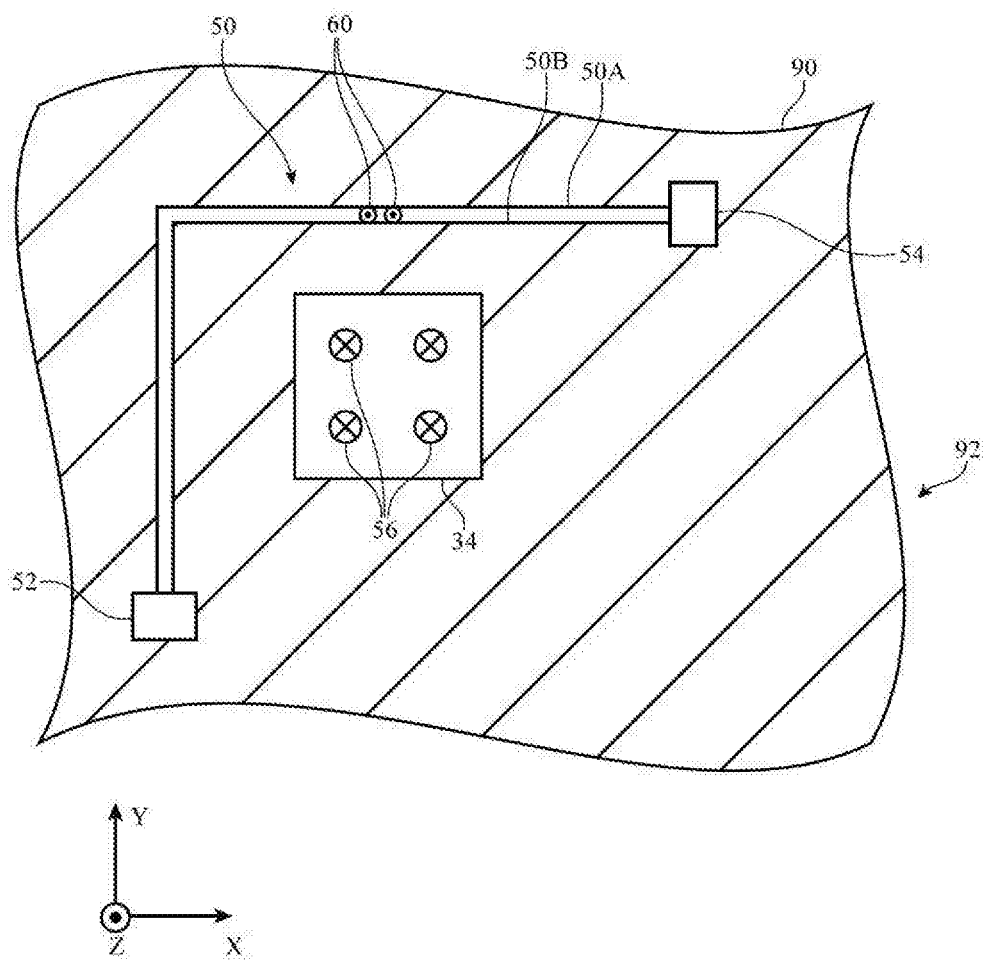
FIG. 4 is a top view of an illustrative flexible printed circuit having signal lines routed around a magnet to minimize vibrations in accordance with an embodiment.

In addition to or instead of vertically stacking signal lines to minimize magnetic field interactions, magnetic field interactions between field 60 and field 56 can be minimized by routing path 50 within the X-Y plane of printed circuit 92 so that overlap between path 50 and magnetic field 56 is minimized or avoided. This type of approach is illustrated in FIG. 4. As shown in FIG. 4, printed circuit 92 has a metal traces that form signal path 50 on substrate 90. The metal traces may form signal lines 50A and 50B. During operation of device 10, signals may be carried between components 52 and 54 over path 50. Because signal lines 50A and 50B and the current loop these lines create are contained within the X-Y plane of substrate 90 (in the example of FIG. 4), induced magnetic fields 60 will be oriented vertically along dimension Z (into and out of the page in the orientation of FIG. 4). Magnetic field 56 from component 34 is also oriented vertically along dimension Z, which gives rise for a potential for magnetic field interactions. Nevertheless, magnetic field interactions and unwanted vibrations are minimized because path 50 is routed around component 34 and magnetic field 56 (i.e., path 50 does not overlap component 34 or magnetic field 56).

In some device configurations, signal lines may be aligned in a vertically overlapping (vertically stacked) configuration of the type shown in FIG. 3 so that induced magnetic field 60 is oriented perpendicular to magnetic field 56 from component 34. In other configurations, signal lines may be laterally routed around component 34 so that the signal lines do not overlap magnet 34. Configurations with both multilayer vertically aligned signal lines and non-overlapping signal line patterns may also be used.

Figure 5:
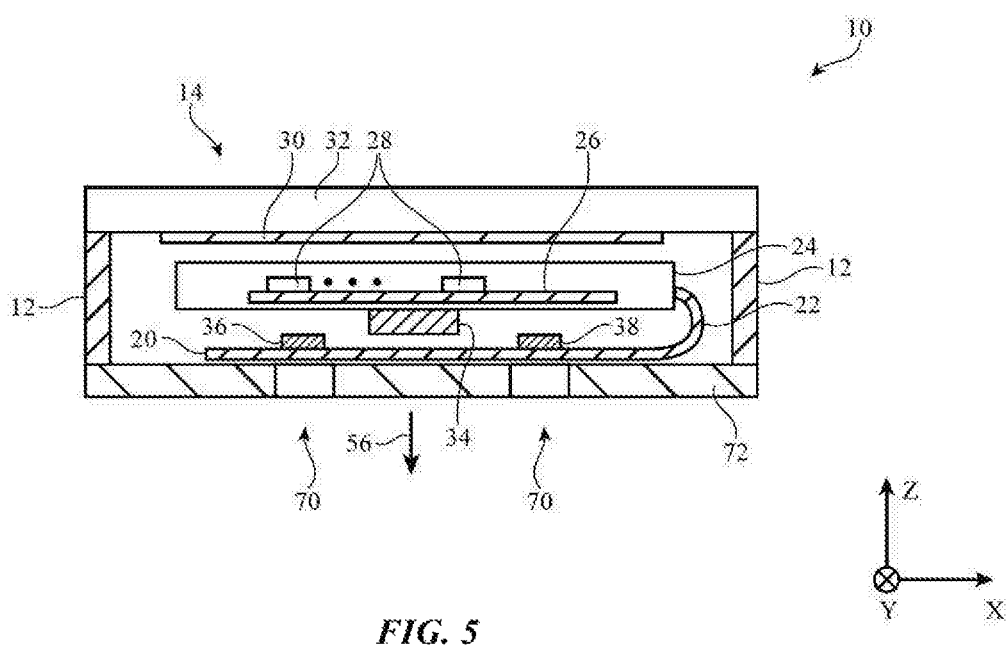
FIG. 5 is a cross-sectional side view of illustrative electronic device with a magnet and a printed circuit that overlaps that magnet in accordance with an embodiment.

FIG. 5 is a diagram of an illustrative electronic device of the type that may include a source of magnetic field 56 such as component 34. Component 34 may be, for example, a permanent magnet that produces a magnetic field such as magnetic field 56 that is oriented vertically (i.e., parallel to vertical dimension Z). Permanent magnet 34 may be used to help hold device 10 to a docking station, may be used as part of a clasp, may be used to help hold together structures in device 10, etc.

Device 10 may include display 14. Display 14 may overlap magnet 34. Display 14 may have a display module such as display module 30. Display module 30 may be an organic light-emitting diode display, a liquid crystal display module, etc. Display module 30 may be mounted under display cover layer 32. Display cover layer 32 may include one or more transparent layers such as structures formed from glass, plastic, sapphire, ceramic, crystalline material, other materials, or combinations of these material.

Display 14 may be mounted in housing 12. Housing 12 may be formed from plastic, glass, metal, carbon-fiber material or other fiber composites, or other suitable materials.

The interior of device 10 may include components 24. Components 24 may include batteries, integrated circuits, sensors, buttons, and other input-output devices 18 and control circuitry 16. As shown in FIG. 5, components 24 may include devices 28 that are mounted on one or more substrates 26 (e.g., printed circuits, etc.). For example, components 24 may include one or more electrical components 28 that are soldered to printed circuit 26.

In the configuration of device 10 that is shown in FIG. 5, housing 12 has a rear wall such as rear housing wall 72. Housing wall 72 may be formed from plastic, glass, metal, carbon-fiber material or other fiber composites, or other suitable materials. The material(s) used in forming housing wall 72 may be the same as the material used in forming housing sidewalls such as housing walls 12 of FIG. 5 and/or may be different from the material used in forming housing walls 12.

Rear housing wall 72 may include one or more windows such as windows 70. Windows 70 may be formed from a different type of material than the remainder of the material used in forming rear housing wall 72. For example, housing wall 72 may be formed from a material that is opaque, whereas windows 70 may be optical windows formed from optically transparent materials (e.g., materials that allow visible light, infrared light, or other light to pass into and out of the interior of the housing of device 10). As shown in FIG. 5, there may be one or more components in the interior of device 10 that are in alignment with openings 70. For example, device 10 may include components such as components 36 and 38 that are attached to rear housing wall 72 and that are aligned with respective optically transparent windows 70 in rear housing wall 72. There may be any suitable number of windows 70 in device 10 (e.g., one or more, two or more, three or more, four or more, less than five, more than 10, etc.).

Figure 6:
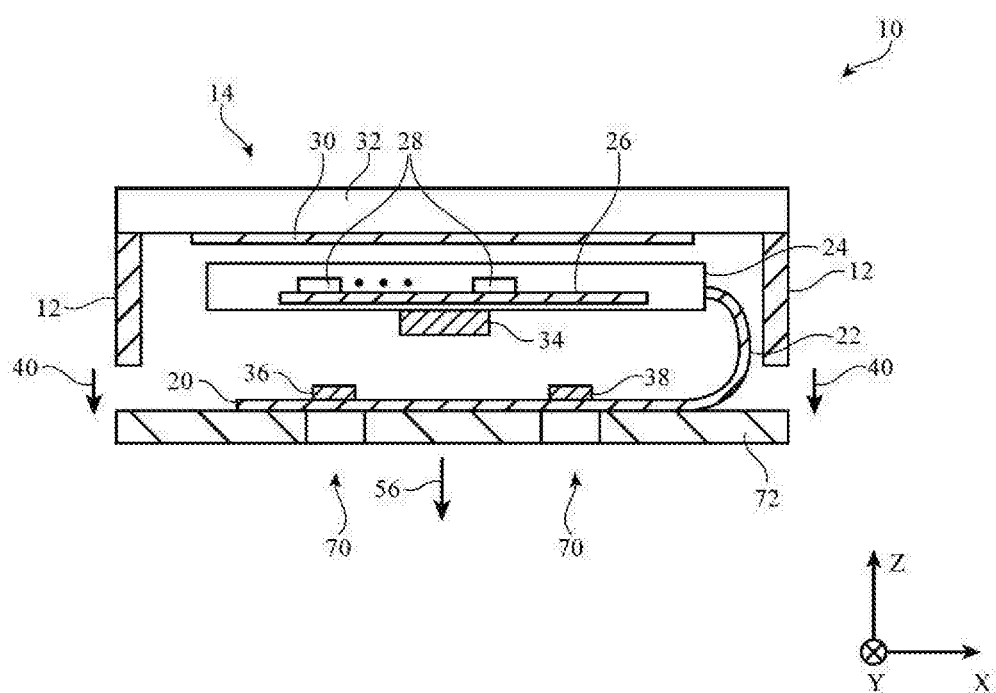
FIG. 6 is a cross-sectional side view of the illustrative electronic device of FIG. 5 in a configuration in which a portion of a device housing is detached from the rest of the device housing in accordance with an embodiment.

Components 36 may be interconnected using signal paths such as paths 50 of FIGS. 2, 3, and 4 in a substrate such as flexible printed circuit 20. A central portion of flexible printed circuit 20 may be attached to rear housing wall 72. Flexible printed circuit 20 may have a tail portion such as tail 22 that couples flexible printed circuit 20 to components 24. Tail 22 of flexible printed circuit 20 may be configured to form a flexible service loop for printed circuit 20. The service loop may be used to facilitate assembly and disassembly of device 10. As shown in FIG. 6, for example, tail 22 may be sufficiently long and flexible to flex so that a detachable portion of rear housing wall 72 can be removed from device housing 12 in direction 40 to facilitate rework or repair of device 10.

To minimize magnetic field interactions that could produce undesirable vibrations and noise in device 10, the signal paths in printed circuit 20 may be routed using vertically stacked signal line configurations of the type shown in FIG. 2 and/or non-overlapping paths of the type shown in FIG. 4.

Figure 7:
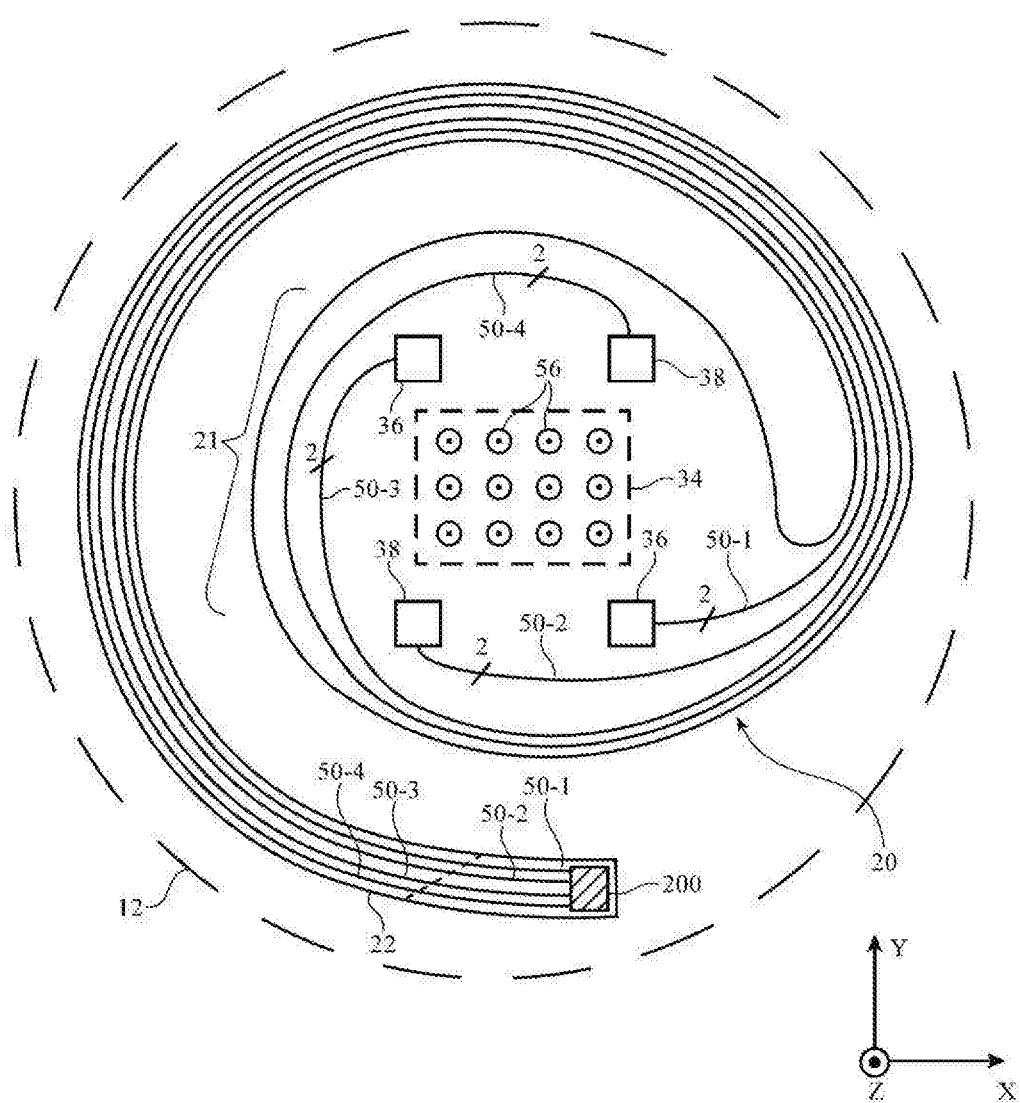
FIG. 7 is a top view of an illustrative flexible printed circuit that has a service loop to accommodate detachment of a detachable portion of a device housing and that has signal lines routed to minimize noise in accordance with an embodiment.

An illustrative configuration for printed circuit 20 of FIGS. 5 and 6 is shown in FIG. 7. In the example of FIG. 7, flexible printed circuit 20 has a circular central portion on which two components 36 and two components 38 have been mounted in a rectangular two-by-two array (i.e., two rows of components and two columns of components). Components 36 may be diagonally opposed to each other in the array and components 38 may be diagonally opposed to each other in the array or other patterns may be used for mounting components 36 and 38 to printed circuit 20. Flexible printed circuit tail 22 has a curved shape (e.g., a shape with curved edges) such as a spiral shape that runs around all or nearly all of the circular periphery of the circular central portion of flexible printed circuit 20 to which components 36 and 38 are mounted.

The outline of printed circuit 20 may be circular so that printed circuit 20 may be accommodated in a housing such as housing 12 that has a circular outline. In the FIG. 7 example, housing 12 has a circular footprint (when viewed in direction −Z) and printed circuit 20 has a corresponding circular footprint. Configurations for device 10 and printed circuit 20 with other shapes (e.g., rectangles, ovals, etc.) may also be used. For example, housing 12 may have a rectangular footprint and some or all of wall 72 (e.g., the detachable portion of wall 72) may have a circular shape. Shapes with combinations of straight and curved edges may also be used for housing 12. The configuration of FIG. 7 is merely illustrative.

Magnet 34 may be located in the center of housing 12, as shown in FIG. 7. Magnetic field 56 (e.g., a static magnetic field from magnet 34) may extend vertically through the center of printed circuit 20 in the vicinity of components 36 and 38 (i.e., along vertical dimension Z). Connector 200 may be used to couple signal paths 50-1, 50-2, 50-3, and 50-4 to components 24. Connector 200 may be, for example, a zero-insertion-force connector or other connector that couples traces on printed circuit 20 to printed circuit 26 on which components 28 have been mounted.

Signal path 50-1 may be coupled between the lower right component 36 and connector 200. Signal path 50-2 may be coupled between the lower left component 38 and connector 200. Signal path 50-3 may be coupled between the upper left component 36 and connector 200. Signal path 50-4 may be coupled between the upper right component 38 and connector 200. Components 36 and 38 may be any suitable components (see, e.g., input-output devices 18, control circuitry 16, etc.). With one illustrative configuration, components 36 are light-emitting diodes that emit light through a first pair of respective windows 70 in rear wall 72 and components 38 are light sensors that detect light that is received through a second pair of respective windows 70. Components 36 and/or 38 may be used as light-based communications devices, as environmental sensors, as proximity sensors, as sensors that detect body characteristics associated with a user of device 10, or other suitable devices.

To minimize vibrations that might result from interactions between induced magnetic fields from the signals running through the signal paths on printed circuit 20 and magnetic field 56, signal paths 50-1, 50-2, 50-3, and 50-4 may be routed around component 34 in a spiral pattern (e.g., a spiral path or other curved path), so that the signal paths do not overlap magnetic field 56. Vertically stacked signal line configurations of the type described in connection with FIG. 2 may also be used to minimize magnetic-field-induced vibrations.

Printed circuit 20 may be a single layer printed circuit in which signal traces are formed on only a single side of a printed circuit substrate or may be a multilayer printed circuit having two or more layers of signal lines, three or more layers of signal lines, or four or more layers of signal lines. Signal lines on different layers of printed circuit 20 may be coupled using vias (e.g., metal vias that couple adjacent metal layers by passing through an intervening dielectric substrate layer).

With one illustrative configuration, the service loop portion of printed circuit 20 (i.e., spiral tail 22) may be a two layer flexible printed circuit and circular central portion 21 of printed circuit 20 that overlaps magnet 34 may be a three layer flexible printed circuit. The use of three layers for the central portion of printed circuit 20 may allow printed circuit 20 to be provided with a grounded shielding layer that can help electromagnetically shield signal lines and components that are sensitive to electromagnetic noise. Other types of printed circuit may be used if desired. The use of a printed circuit that contains a tail portion with two metal layers and a central portion with three metal layers is merely illustrative.

Figure 8:
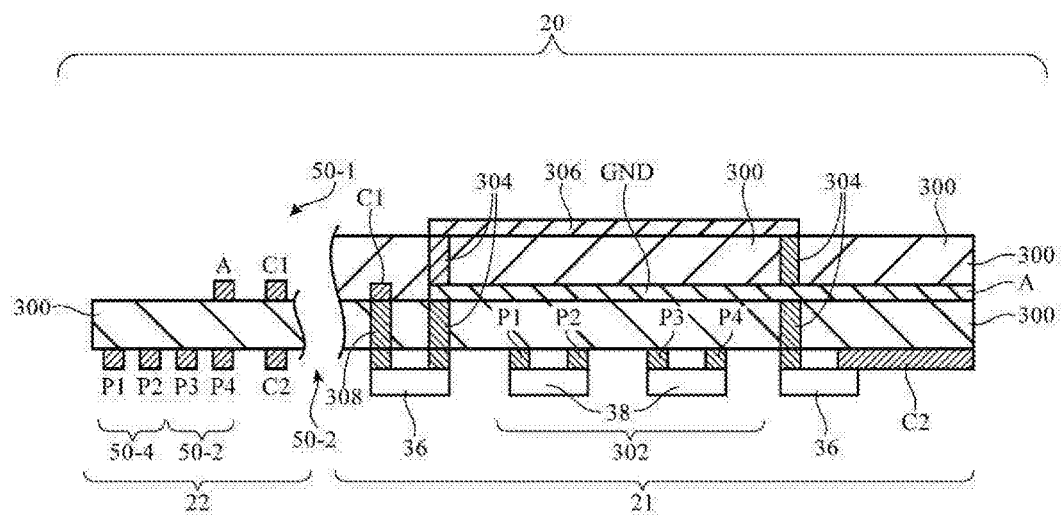
FIG. 8 is a cross-sectional side view of flexible printed circuit structures of the type that may be associated with the flexible printed circuit of FIG. 7 in accordance with an embodiment.

FIG. 8 is a cross-sectional side view of structures of the type that may be included in a printed circuit having a two-layer tail and a three-layer central region. As shown in FIG. 8, printed circuit 20 may have a three layer central portion such as central portion 21 and may have a two-layer tail such as tail 22 that forms a service loop, as described in connection with FIGS. 5 and 6. Dielectric 300 (e.g., a flexible layer of polyimide or other flexible sheet of polymer material) may serve as a substrate for printed circuit 20. Patterned metal traces (e.g., photolithographically patterned blanket layers of metal and vertical metal vias that couple signal lines in respective layers of printed circuit 20) may be used in forming signal paths 50-1, 50-2, 50-3, and 50-4.

In tail 22, signal path 50-4 may be formed from sensor lines P1 and P2 on the lower surface of substrate 300. Signal path 50-2 may be formed from sensor lines P3 and P4. These lines may be routed to portion 21 and may be coupled to sensors 38. Ground layer GND may form electromagnetic shielding for the sensor paths and sensors 38 in region 302.

Path 50-1 may be formed from cathode line C1 and anode A in tail 22. Path 50-2 may be formed from cathode line C2 and anode A in tail 22. Anode A may be formed from separate lines or may be shared between paths 50-1 and 50-2.

In region 21, anode line A may be coupled to light-emitting diodes 36 using vias 304 and a third layer of metal traces (layer 306). Cathode C1 may be routed to the lowermost metal layer in region 21 using via 308. Cathode C2 may remain on the lowermost layer in both tail region 22 and in central region 21.

The cross-sectional side view of FIG. 8 illustrates how a two-layer flexible printed circuit design allows tail 22 to be formed from relatively thin and flexible structures, whereas a three-layer flexible printed circuit design allows shielding layer GND to overlap and shield sensors 38. Vias can be used to form paths between signal lines on different layers of printed circuit 20. If desired, printed circuit 20 may be formed entirely as a three layer substrate, may include portions with four or more layers, may have only two layer portions, may be formed as a single layer printed circuit, or may have other combinations of flexible printed circuit layers. The arrangement of FIG. 8 is described as an example.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing;
   a display mounted in the housing;
   a permanent magnet mounted under the display that produces a static magnetic field;
   a light-emitting diode;
   a printed circuit on which the light-emitting diode is mounted, wherein the static magnetic field at least partially passes through the printed circuit and the light-emitting diode is mounted to the printed circuit in the vicinity of the permanent magnet; and
   signal lines on the printed circuit that are coupled to the light-emitting diode, wherein the signal lines produce a second magnetic field and are configured to reduce vibrations in the printed circuit due to interactions between the static magnetic field and the second magnetic field.

2. The electronic device defined in claim 1 wherein the signal lines are vertically stacked to minimize interactions between the static magnetic field and the second magnetic field.

3. The electronic device defined in claim 1 wherein the signal lines are routed around the permanent magnet so that the signal lines do not overlap the permanent magnet to minimize interactions between the static magnetic field and the second magnetic field.

4. The electronic device defined in claim 1 wherein the printed circuit comprises a flexible printed circuit that has a curved edge.

5. The electronic device defined in claim 1 further comprising a light sensor.

6. The electronic defined in claim 5 wherein the light-emitting diode and the light sensor detect a body characteristic associated with a user of the electronic device.

7. The electronic device defined in claim 1 wherein the signal lines include first and second metal traces that are coupled to the light-emitting diode and that do not overlap the permanent magnet.

8. The electronic device defined in claim 7 wherein the first and second metal traces spiral around the permanent magnet.

9. The electronic device defined in claim 1 wherein the permanent magnet is configured to hold the electronic device to a docking station.

10. An electronic device, comprising:
a housing;
a display mounted in the housing;
a source of a magnetic field mounted under the display;
a light-emitting diode;
a light sensor, wherein the light-emitting diode and the light sensor detect body characteristics associated with a user of the electronic device;
a printed circuit on which the light-emitting diode is mounted, wherein the magnetic field at least partially passes through the printed circuit and the light-emitting diode is mounted to the printed circuit in the vicinity of the source of the magnetic field; and
at least one signal line on the printed circuit that is coupled to the light-emitting diode, wherein the at least one signal line produces a second magnetic field and is configured to reduce vibrations in the printed circuit due to interactions between the magnetic field and the second magnetic field.

11. The electronic device defined in claim 10 wherein the at least one signal line comprises first and second signal lines that are vertically stacked to minimize interactions between the magnetic field and the second magnetic field.

12. The electronic device defined in claim 10 wherein the at least one signal line is routed around the source of the magnetic field so that the at least one signal line does not overlap the source of the magnetic field to minimize interactions between the magnetic field and the second magnetic field.

13. The electronic device defined in claim 10 wherein the at least one signal line includes first and second metal traces that are coupled to the light-emitting diode and that do not overlap the source of the magnetic field.

14. The electronic device defined in claim 10 wherein the source of the magnetic field is a permanent magnet.

15. An electronic device, comprising:
a housing;
a display mounted in the housing;
a permanent magnet mounted under the display that produces a static magnetic field;
a light-emitting diode; and
signal lines that are coupled to the light-emitting diode, wherein the signal lines produce a second magnetic field and are configured to reduce magnetic-field-induced vibrations due to interactions between the static magnetic field and the second magnetic field.

16. The electronic device defined in claim 15 further comprising:
a light sensor, wherein the light-emitting diode and the light sensor are configured to detect a body characteristic associated with a user of the electronic device.

17. The electronic device defined in claim 15 wherein the signal lines are vertically stacked to minimize interactions between the static magnetic field and the second magnetic field.

18. The electronic device defined in claim 15 wherein the signal lines are routed around the permanent magnet so that the signal lines do not overlap the permanent magnet to minimize interactions between the magnetic field and the second magnetic field.

19. The electronic device defined in claim 15 wherein the signal lines include first and second metal traces that are coupled to the light-emitting diode and that do not overlap the permanent magnet.

20. The electronic device defined in claim 15 wherein the permanent magnet is configured to hold the electronic device to a docking station.

* * * * *